US012620731B2

(12) United States Patent

Escamilla et al.

(10) Patent No.: US 12,620,731 B2
(45) Date of Patent: May 5, 2026

(54) CABLE CARRIER ADAPTER FOR CONNECTIVITY TO CIRCUIT BOARD AND CONNECTOR

(71) Applicant: Dell Products L.P., Round Rock, TX (US)

(72) Inventors: Eduardo Escamilla, Round Rock, TX (US); Robert G. Bassman, Dalton, MA (US); Walter R. Carver, Round Rock, TX (US); William A. Smith, Round Rock, TX (US)

(73) Assignee: Dell Products L.P., Round Rock, TX (US)

( * ) Notice: Subject to any disclaimer, the term of this patent is extended or adjusted under 35 U.S.C. 154(b) by 349 days.

(21) Appl. No.: 18/240,761

(22) Filed: Aug. 31, 2023

(65) Prior Publication Data

US 2025/0079733 A1 Mar. 6, 2025

(51) Int. Cl.
| | |
|---|---|
| *H01R 12/70* | (2011.01) |
| *H01R 12/75* | (2011.01) |
| *H01R 12/79* | (2011.01) |
| *H01R 13/627* | (2006.01) |
| *H05K 7/14* | (2006.01) |

(52) U.S. Cl.
CPC ......... *H01R 12/7005* (2013.01); *H01R 12/75* (2013.01); *H01R 12/79* (2013.01); *H01R 13/627* (2013.01); *H05K 7/1422* (2013.01)

(58) Field of Classification Search
CPC .... H01R 12/7005; H01R 12/75; H01R 12/79; H01R 13/627; H05K 7/1422

USPC ..................................................... 439/55, 630
See application file for complete search history.

(56) References Cited

U.S. PATENT DOCUMENTS

| | | | | |
|---|---|---|---|---|
| 4,773,867 | A * | 9/1988 | Keller | H01R 31/06 |
| | | | | 379/325 |
| 5,387,110 | A * | 2/1995 | Kantner | H01R 29/00 |
| | | | | 439/325 |
| 5,538,437 | A * | 7/1996 | Bates, III | H01R 13/6275 |
| | | | | 439/352 |
| 5,836,781 | A * | 11/1998 | Hyzin | H01R 13/6276 |
| | | | | 439/348 |
| 6,146,180 | A * | 11/2000 | Betker | H01R 13/6273 |
| | | | | 439/352 |
| 6,149,450 | A * | 11/2000 | Gastineau | G06K 19/07741 |
| | | | | 439/352 |
| 6,241,558 | B1 * | 6/2001 | Mosquera | H01R 13/2442 |
| | | | | 439/500 |

(Continued)

*Primary Examiner* — Harshad C Patel
(74) *Attorney, Agent, or Firm* — Jackson Walker L.L.P.

(57) ABSTRACT

A cable assembly may include a cable terminated with a cable termination configured to electrically couple the cable to a first circuit board and a cable carrier adapter comprising mechanical features configured to mechanically couple the cable and the cable termination in a fixed position relative to the cable carrier adapter and physical dimensions substantially similar to that of a second circuit board configured to electrically and mechanically couple to the first circuit board such that the cable carrier adapter is configured to mechanically engage with guiding features of a housing of the first circuit board for mechanically guiding the second circuit board relative to the first circuit board in order to guide the cable carrier adapter relative to the first circuit board to electrically couple the cable to the first circuit board via the cable termination.

15 Claims, 4 Drawing Sheets

(56)                  References Cited

U.S. PATENT DOCUMENTS

| | | | |
|---|---|---|---|
| 6,244,889 B1 * | 6/2001 | James .................. | H01R 13/707 |
| | | | 439/258 |
| 6,585,528 B1 * | 7/2003 | Lin .................... | H01R 13/6658 |
| | | | 439/942 |
| 10,028,403 B1 * | 7/2018 | Hartman ................ | H05K 7/142 |
| 10,923,842 B1 * | 2/2021 | Lynn ...................... | H01R 12/58 |
| 11,777,256 B2 * | 10/2023 | Fan ...................... | H01R 13/639 |
| | | | 439/489 |
| 2011/0011635 A1 * | 1/2011 | Ondelj ................. | H05K 1/0271 |
| | | | 29/832 |
| 2020/0227851 A1 * | 7/2020 | Do ......................... | H01R 12/75 |
| 2021/0044044 A1 * | 2/2021 | Stathakis .............. | H01R 13/64 |
| 2022/0021137 A1 * | 1/2022 | Rita ...................... | H01R 12/53 |
| 2022/0224034 A1 * | 7/2022 | Do ....................... | H01R 43/205 |
| 2022/0336981 A1 * | 10/2022 | Wang ..................... | H01R 27/02 |
| 2023/0307854 A1 * | 9/2023 | Pritchard .............. | H01R 12/53 |

* cited by examiner

CABLE CARRIER ADAPTER FOR CONNECTIVITY TO CIRCUIT BOARD AND CONNECTOR

TECHNICAL FIELD

The present disclosure relates in general to information handling systems, and more particularly to a cable carrier adapter for adapting a cabled connection to a circuit board connector which is configured to receive a corresponding connector of a second circuit board.

BACKGROUND

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Information handling systems may often use one or more industry-standard form factors and connector interface circuit cards. For example, a connector interface paddle board may include a slot configured to receive a corresponding circuit board that comprises electrical components and may assemble into the slot via rails and a latch. In some instances, it may be desirable to adapt the physical slot to enable a form factor-compliant physical board that requires a subset of features and/or a subset of the full connector width as compared to the industry standard circuit board connector interface. In such instances, it may be optimal (e.g., due to solution cost, excessive features and/or capabilities including signal integrity and/or bus width of signals passing through the connector) to use a simplified connector interface circuit card in place of full capabilities of the industry standard connector interface circuit board in order to couple the cable to a compliant industry standard interface.

SUMMARY

In accordance with the teachings of the present disclosure, the disadvantages and problems associated with coupling a cable to a connector configured to receive a circuit board may be substantially reduced or eliminated.

In accordance with embodiments of the present disclosure, a cable assembly may include a cable terminated with a cable termination configured to electrically couple the cable to a first circuit board, and a cable carrier adapter comprising mechanical features configured to mechanically couple the cable and the cable termination in a fixed position relative to the cable carrier adapter and physical dimensions substantially similar to that of a second circuit board configured to electrically and mechanically couple to the first circuit board such that the cable carrier adapter is configured to mechanically engage with guiding features of a housing of the first circuit board for mechanically guiding the second circuit board relative to the first circuit board in order to guide the cable carrier adapter relative to the first circuit board to electrically couple the cable to the first circuit board via the cable termination.

In accordance with these and other embodiments of the present disclosure, a cable carrier adapter may include mechanical features configured to mechanically couple a cable and a cable termination terminating the cable in a fixed position relative to the cable carrier adapter, and physical dimensions substantially similar to that of a second circuit board configured to electrically and mechanically couple to the first circuit board such that the cable carrier adapter is configured to mechanically engage with guiding features of a housing of the first circuit board for mechanically guiding the second circuit board relative to the first circuit board in order to guide the cable carrier adapter relative to the first circuit board to electrically couple the cable to the first circuit board via the cable termination.

In accordance with these and other embodiments of the present disclosure, a method may include forming mechanical features in a cable carrier adapter such that the mechanical features are configured to mechanically couple a cable and a cable termination terminating the cable in a fixed position relative to the cable carrier adapter, and forming physical dimensions of the cable carrier adapter substantially similar to that of a second circuit board configured to electrically and mechanically couple to the first circuit board such that the cable carrier adapter is configured to mechanically engage with guiding features of a housing of the first circuit board for mechanically guiding the second circuit board relative to the first circuit board in order to guide the cable carrier adapter relative to the first circuit board to electrically couple the cable to the first circuit board via the cable termination.

Technical advantages of the present disclosure may be readily apparent to one skilled in the art from the figures, description and claims included herein. The objects and advantages of the embodiments will be realized and achieved at least by the elements, features, and combinations particularly pointed out in the claims.

It is to be understood that both the foregoing general description and the following detailed description are examples and explanatory and are not restrictive of the claims set forth in this disclosure.

BRIEF DESCRIPTION OF THE DRAWINGS

A more complete understanding of the present embodiments and advantages thereof may be acquired by referring to the following description taken in conjunction with the accompanying drawings, in which like reference numbers indicate like features, and wherein:

FIG. 1A illustrates an example first circuit board and second circuit board configured to couple to the first circuit board, in accordance with the present disclosure;

DETAILED DESCRIPTION

Figure 1A:
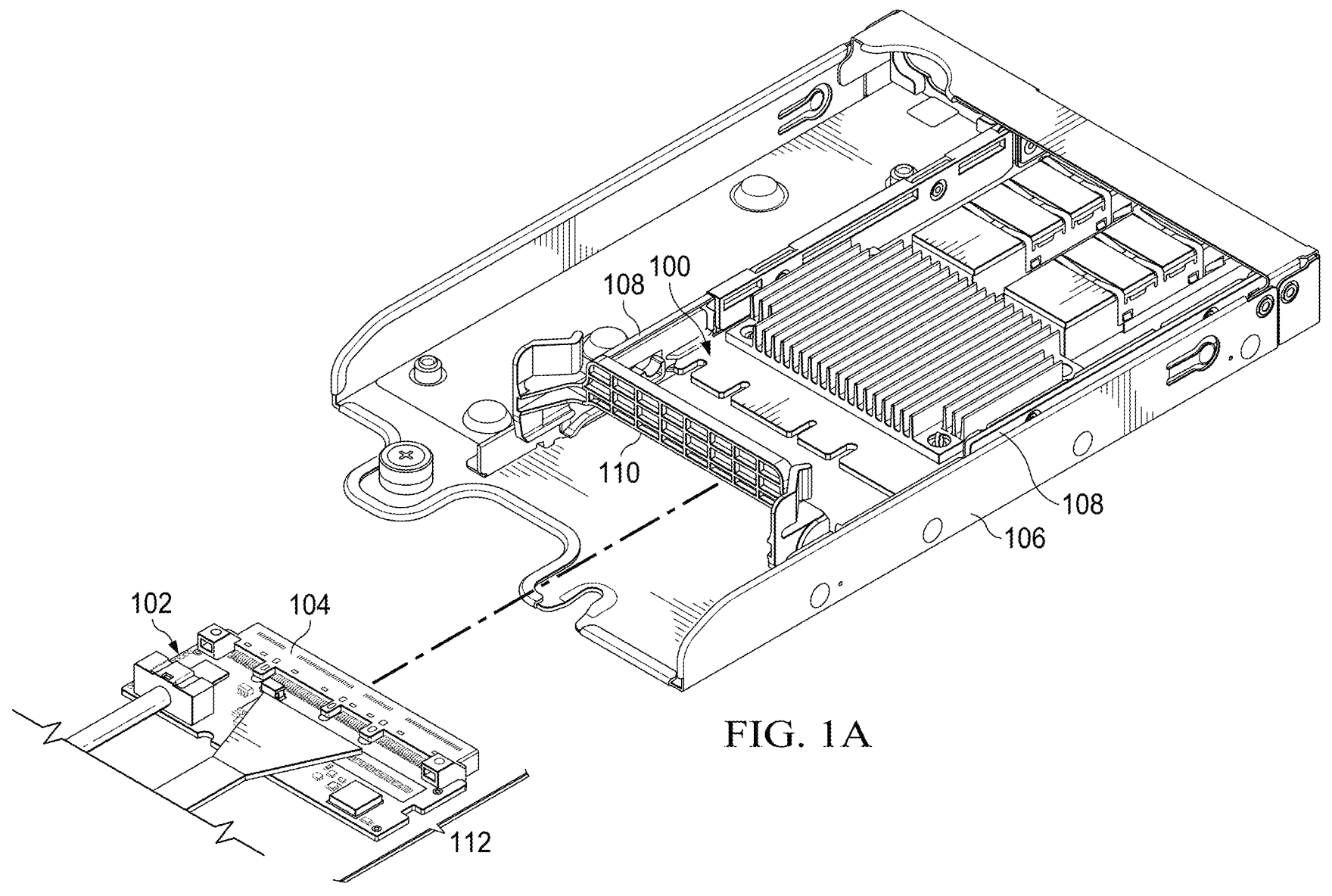
Figure 1B:
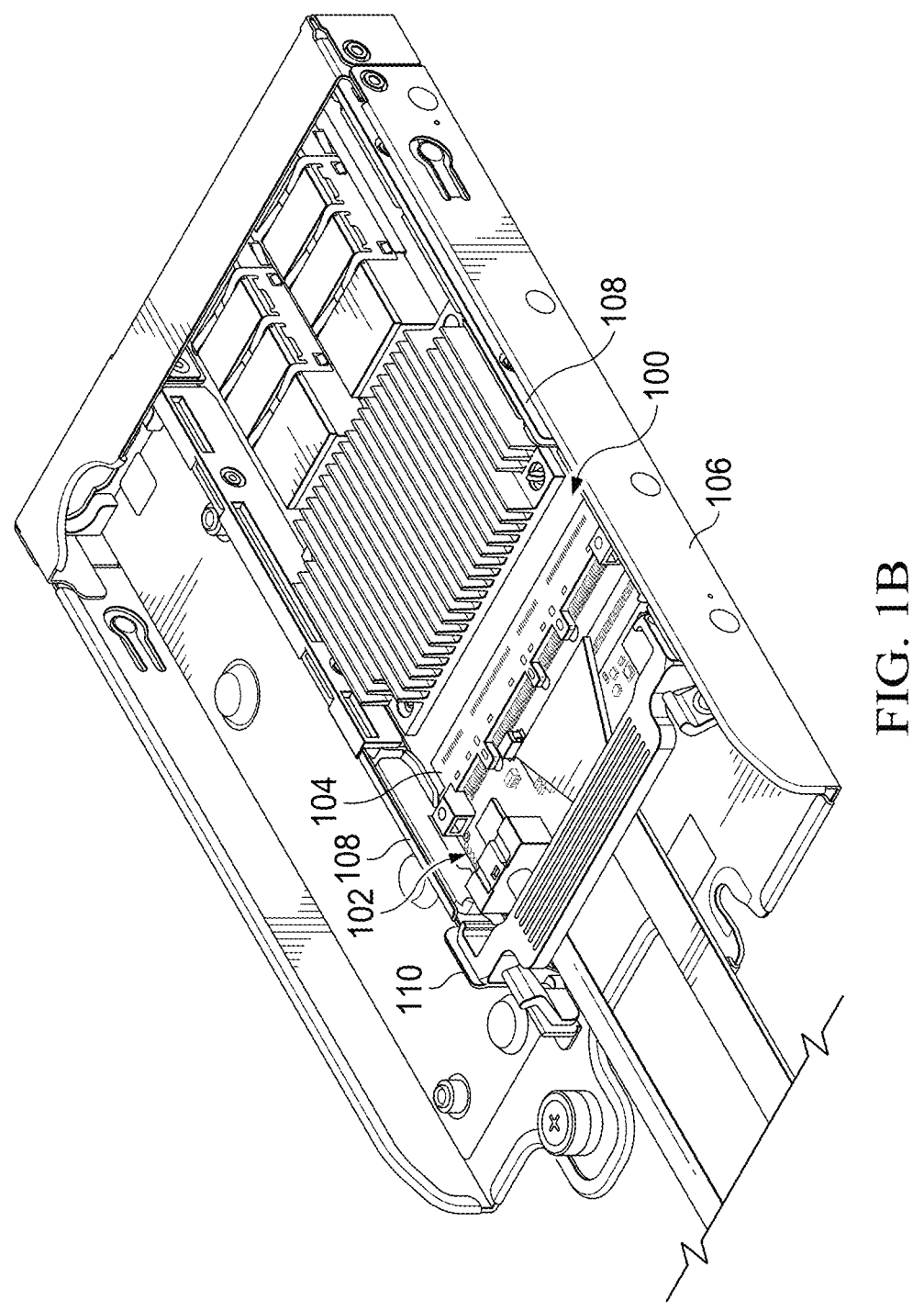
FIG. 1B illustrates the first circuit board and second circuit board depicted in FIG. 1A coupled to one another, in accordance with the present disclosure.

Preferred embodiments and their advantages are best understood by reference to FIGS. 1A through 2B, wherein like numbers are used to indicate like and corresponding parts.

For the purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, an information handling system may be a personal computer, a PDA, a consumer electronic device, a network storage device, or any other suitable device and may vary in size, shape, performance, functionality, and price. The information handling system may include memory, one or more processing resources such as a central processing unit (CPU) or hardware or software control logic. Additional components or the information handling system may include one or more storage devices, one or more communications ports for communicating with external devices as well as various input and output (I/O) devices, such as a keyboard, a mouse, and a video display. The information handling system may also include one or more buses operable to transmit communication between the various hardware components.

For the purposes of this disclosure, information handling resources may broadly refer to any component system, device or apparatus of an information handling system, including without limitation processors, buses, memories, input-output devices and/or interfaces, storage resources, network interfaces, motherboards, integrated circuit packages; electro-mechanical devices (e.g., air movers), displays, and power supplies.

For the purposes of this disclosure, circuit boards may broadly refer to printed circuit boards (PCBs), printed wiring boards (PWBs), printed wiring assemblies (PWAs), etched wiring boards, and/or any other board or similar physical structure operable to mechanically support and electrically couple electronic components (e.g., packaged integrated circuits, slot connectors, etc.). A circuit board may comprise a substrate of a plurality of conductive layers separated and supported by layers of insulating material laminated together, with conductive traces disposed on and/or in any of such conductive layers, with vias for coupling conductive traces of different layers together, and with pads for coupling electronic components (e.g., packaged integrated circuits, slot connectors, etc.) to conductive traces of the circuit board.

FIG. 1A illustrates an example first circuit board 100 and second circuit board 102 configured to couple to first circuit board 100, in accordance with the present disclosure. Each of first circuit board 100 and second circuit board 102 may also be referred to as "cards." For example, in some embodiments, first circuit board 100 may be an open compute platform (OCP) card or any primary circuit board that delivers connectivity to an input/output system (e.g., an OCP) of an information handling system. First circuit board 100 may be a pluggable device (e.g., a circuit card) that plugs into an expansion slot in a chassis of an information handling system to allow for custom input/output connectivity into the chassis. As another example, second circuit board 102 may comprise another card configured to couple to first circuit board 100 via a board connector 104 of second circuit board 102. For example, board connector 104 may comprise a Small Form Factor (SFF) TA-1002 type connector or other suitable connector. Together, second circuit board 102 and board connector 104 of second circuit board 102 may comprise a circuit card assembly 112.

As also shown in FIG. 1A, a carrier 106 or other housing may include first circuit board 100 coupled thereto. Carrier 106 may include rails 108 or other mechanical features for mechanically guiding board connector 104 of second circuit board 102 for electrical and mechanical coupling of board connector 104 to first circuit board 100. As shown in FIG. 1A, rails 108 may be positioned on either side of first circuit board 100, and a distance between rails 108 may be slightly greater than a width of second circuit board 102 such that circuit card assembly 112 may be mechanically guided to electrically and mechanically couple to first circuit board 100 by aligning the side edges of circuit board 102 with rails 108 and sliding circuit card assembly 112 into carrier 106 until board connector 104 of second circuit board 102 mechanically and electrically engages with first circuit board 100, as further described below with respect to FIG. 1B. Further, carrier 106 may include a latch 110 or other mechanical structure configured to maintain electrical and mechanical coupling of board connector 104 to first circuit board 100.

FIG. 1B illustrates first circuit board 100 and second circuit board 102 coupled to one another, in accordance with the present disclosure. As shown in FIG. 1B, second circuit board 102 may be coupled to first circuit board 100 by engaging board connector 104 to first circuit board 100 and rotating rotatable latch 110 from an open position (as shown in FIG. 1A) to a closed position (as shown in FIG. 1B). As shown in FIG. 1B, rotatable latch 110 may physically couple to circuit card assembly 112 (e.g., by pressing on circuit card assembly 112) and further act as a physical barrier to prevent disengagement of circuit card assembly 112 from first circuit board 100.

As suggested in the background section, in some instances, it may be desirable to couple a cable to first circuit board 100 in lieu of second circuit board 102, wherein such cable requires a subset of features and/or a subset of the full connector width as compared to second circuit board 102. In such instances, it may be non-optimal (e.g., due to cost or signal integrity of signals passing through the cable) to use a circuit board in place of second circuit board 102 in order to couple the cable to first circuit board 100.

Figure 2A:
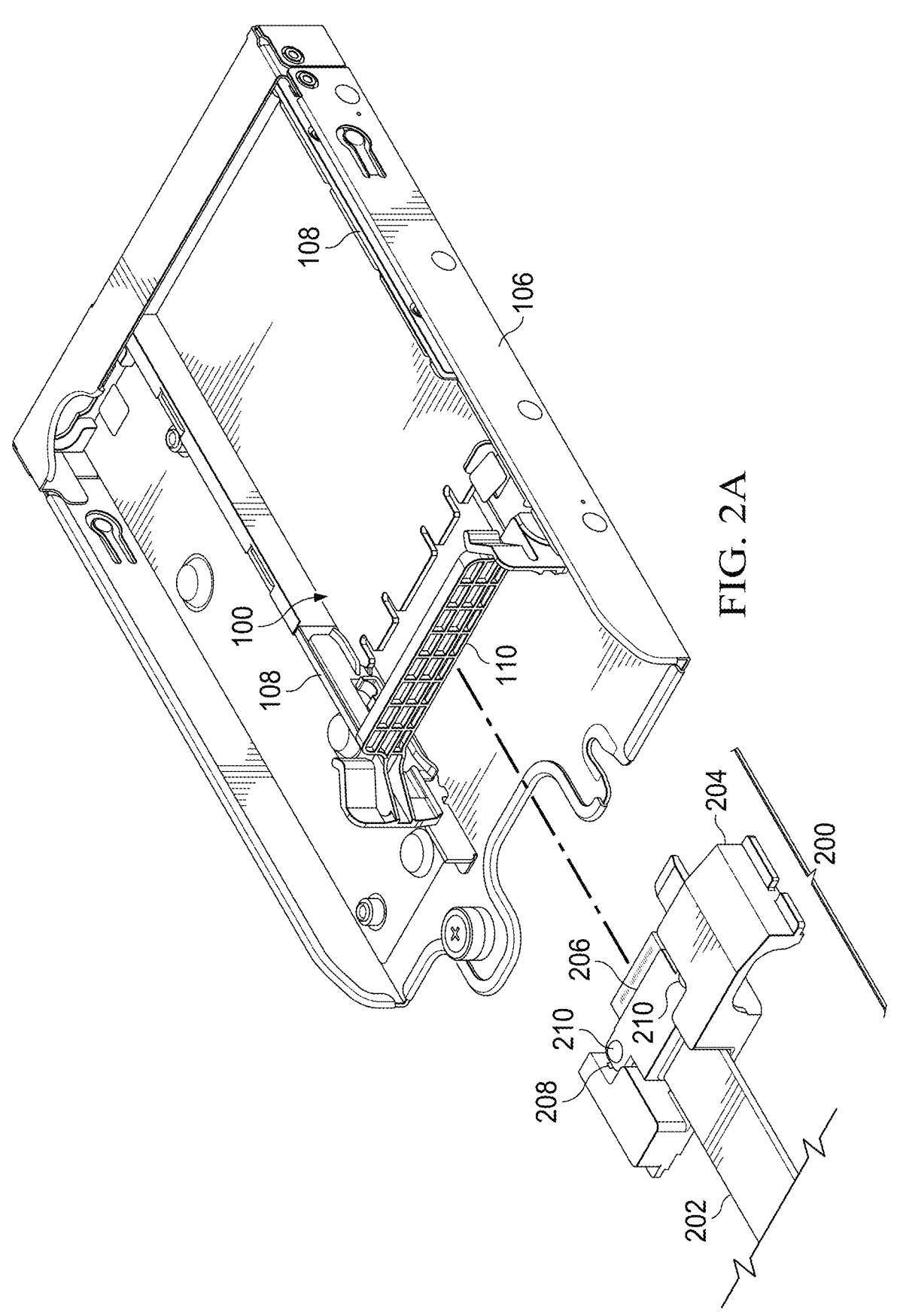
FIG. 2A illustrates the first circuit board of FIG. 1A and a cable assembly comprising a cable and cable carrier adapter in a form factor substantially similar to that of the second circuit board, the cable assembly configured to couple to the first circuit board, in accordance with the present disclosure.

FIG. 2A illustrates a cable assembly 200 comprising a cable 202 and cable carrier adapter 204, formed of plastic or other material, and substantially free of electronic components, in accordance with the present disclosure. As shown in FIG. 2A, cable carrier adapter 204 may include mechanical features, such as groove 208 and mechanical fasteners 210 (e.g., screws) for mechanically coupling cable 202 and its cable termination 206 in a fixed position relative to cable carrier adapter 204.

In addition, cable carrier adapter 204 may be configured (e.g., sized and shaped) to have physical dimensions substantially similar to that of second circuit board 102, such that rails 108 or other mechanical features for mechanically guiding board connector 104 of second circuit board 102 toward first circuit board 100 in order to electrically and mechanically couple circuit board 102 to first circuit board 100 may also be used for mechanically guiding cable termination 206 of cable 202 toward first circuit board 100 in order to mechanically and electrically couple cable 202 to first circuit board 100 via cable termination 206 of cable 202. For example, side edges of cable carrier adapter may substantially align with rails 108 such that cable assembly 200 may slide into carrier 106 toward first circuit board 100 such that cable termination 206 is mechanically guided toward first circuit board 100 until cable termination 206 mechanically and electrically couples to first circuit board 100. Further, cable carrier adapter 204 may be configured (e.g., sized and shaped) to have physical dimensions substantially similar to that of second circuit board 102, such that latch 110 may mechanically retain cable termination 206 coupled to first circuit board 100. For example, as shown in comparing FIGS. 2A-2B (showing cable carrier adapter 204) with FIGS. 1A-1B (showing second circuit board 102), a width of cable carrier adapter 204 may be substantially equal to a width of second circuit board 102. As further shown, latch 110 may physically couple to cable carrier assembly 200 (e.g., by pressing on cable 202) and further act as a physical barrier to prevent disengagement of cable 202 from first circuit board 100.

Figure 2B:
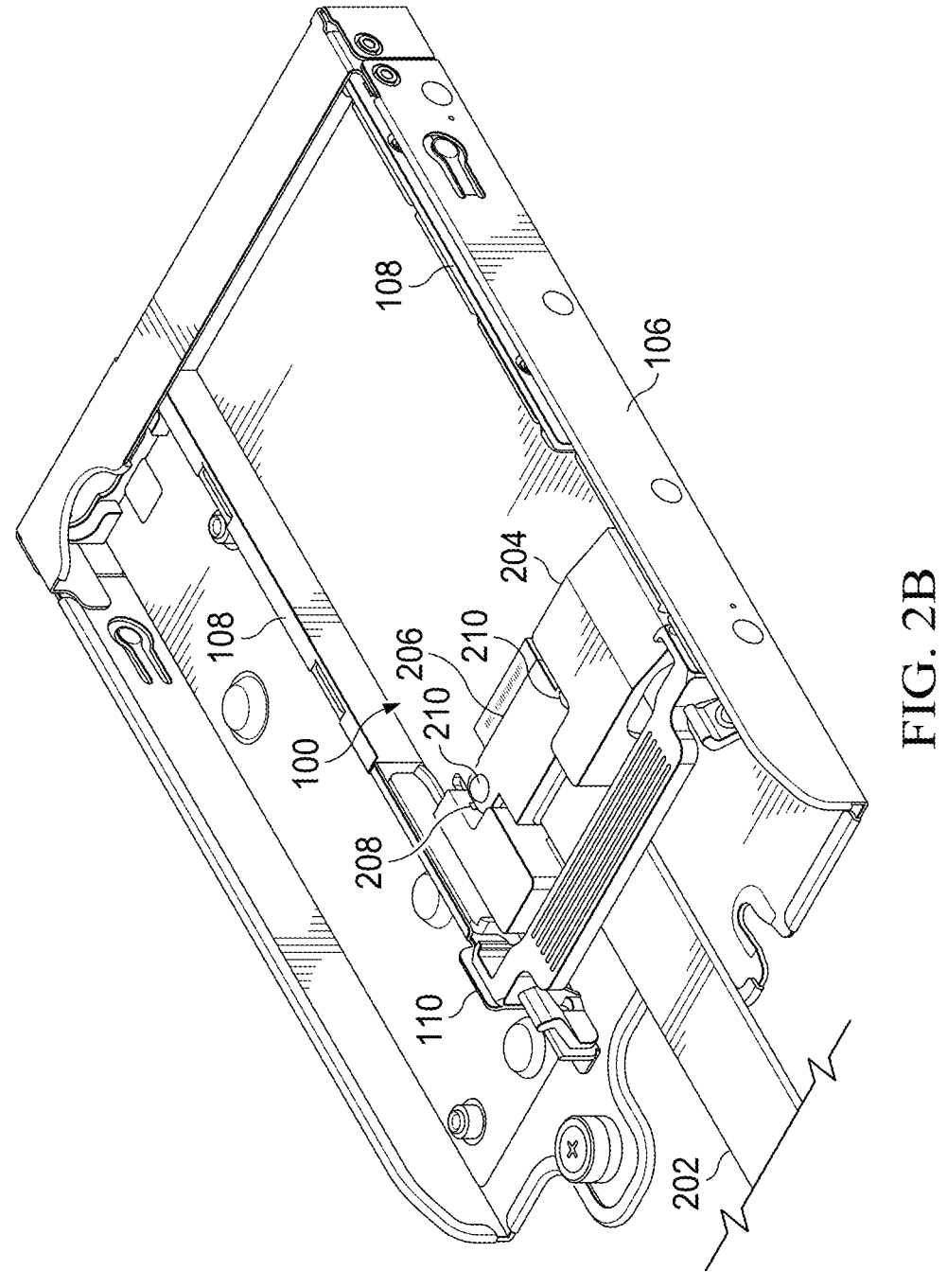
FIG. 2B illustrates the first circuit board and cable assembly depicted in FIG. 2A coupled to one another, in accordance with the present disclosure.

FIG. 2B illustrates cable 202 electrically coupled to first circuit board 100 via cable termination 206 of cable 202, in accordance with the present disclosure. As shown in FIG. 2B, cable 202 may be coupled to first circuit board 100 by mechanically engaging cable carrier adapter 204 with guiding mechanical features (e.g., rails 108) in order to mechanically and electrically couple cable termination 206 to first circuit board 100 and rotating rotatable latch 110 from an open position (as shown in FIG. 2A) to a closed position (as shown in FIG. 2B). Latch 110 may thus physically couple to cable carrier assembly 200 (e.g., by pressing on cable 202) and further act as a physical barrier to prevent disengagement of cable 202 from first circuit board 100.

Using the systems and methods described above, a first circuit board comprising an industry standard form factor card may electrically and mechanically couple to a second circuit board comprising a card compliant with the industry standard form factor card and wherein the second circuit board provides alternative function to an intent of an industry standard associated with the industry standard form factor card. The first circuit board may further electrically and mechanically couple to a cable mechanically coupled to a cable carrier adapter that has physical dimensions substantially similar to the second circuit board such that mechanical engagement features of a carrier or other housing that houses the first circuit board may further mechanically guide or retain the second circuit board coupled to the first circuit board or the cable coupled to the first circuit board. Thus, using the systems and methods described above, a cable may be coupled to a first circuit board used in lieu of a second circuit board. That is, the cable carrier assembly comprising the cable and carrier adapter may be interchangeable with the second circuit board assembly comprising the second circuit board and board connector.

As used herein, when two or more elements are referred to as "coupled" to one another, such term indicates that such two or more elements are in electronic communication or mechanical communication, as applicable, whether connected indirectly or directly, with or without intervening elements.

This disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative. Accordingly, modifications, additions, or omissions may be made to the systems, apparatuses, and methods described herein without departing from the scope of the disclosure. For example, the components of the systems and apparatuses may be integrated or separated. Moreover, the operations of the systems and apparatuses disclosed herein may be performed by more, fewer, or other components and the methods described may include more, fewer, or other steps. Additionally, steps may be performed in any suitable order. As used in this document, "each" refers to each member of a set or each member of a subset of a set.

Although exemplary embodiments are illustrated in the figures and described above, the principles of the present disclosure may be implemented using any number of techniques, whether currently known or not. The present disclosure should in no way be limited to the exemplary implementations and techniques illustrated in the figures and described above.

Unless otherwise specifically noted, articles depicted in the figures are not necessarily drawn to scale.

All examples and conditional language recited herein are intended for pedagogical objects to aid the reader in understanding the disclosure and the concepts contributed by the inventor to furthering the art, and are construed as being without limitation to such specifically recited examples and conditions. Although embodiments of the present disclosure have been described in detail, it should be understood that various changes, substitutions, and alterations could be made hereto without departing from the spirit and scope of the disclosure.

Although specific advantages have been enumerated above, various embodiments may include some, none, or all of the enumerated advantages. Additionally, other technical advantages may become readily apparent to one of ordinary skill in the art after review of the foregoing figures and description.

To aid the Patent Office and any readers of any patent issued on this application in interpreting the claims appended hereto, applicants wish to note that they do not intend any of the appended claims or claim elements to invoke 35 U.S.C. § 112(f) unless the words "means for" or "step for" are explicitly used in the particular claim.

What is claimed is:

1. A cable assembly comprising:

a cable terminated with a cable termination configured to electrically couple the cable to a first circuit board; and a cable carrier adapter comprising:

mechanical features configured to mechanically couple the cable and the cable termination in a fixed position relative to the cable carrier adapter; and physical dimensions substantially similar to that of a second circuit board configured to electrically and mechanically couple to the first circuit board such that the cable carrier adapter is configured to mechanically engage with guiding features of a housing of the first circuit board for mechanically guiding the second circuit board relative to the first circuit board in order to guide the cable carrier adapter relative to the first circuit board to electrically couple the cable to the first circuit board via the cable termination.

2. The cable assembly of claim 1, the physical dimensions such that the cable carrier adapter is configured to be mechanically retained relative to the first circuit board by a mechanical latch of the housing of the first circuit board configured to retain the second circuit board relative to the first circuit board.

3. The cable assembly of claim 1, wherein the first circuit board comprises an industry standard form factor card.

4. The cable assembly of claim 3, wherein the first circuit board comprises an Open Compute Platform network interface card.

5. The cable assembly of claim 3, wherein the second circuit board comprises a card compliant with the industry standard form factor card that provides alternative function to an intent of an industry standard associated with the industry standard form factor card.

6. A cable carrier adapter comprising:
  mechanical features configured to mechanically couple a cable and a cable termination terminating the cable in a fixed position relative to the cable carrier adapter; and
  physical dimensions substantially similar to that of a second circuit board configured to electrically and mechanically couple to the first circuit board such that the cable carrier adapter is configured to mechanically engage with guiding features of a housing of the first circuit board for mechanically guiding the second circuit board relative to the first circuit board in order to guide the cable carrier adapter relative to the first circuit board to electrically couple the cable to the first circuit board via the cable termination.

7. The cable carrier adapter of claim 6, the physical dimensions such that the cable carrier adapter is configured to be mechanically retained relative to the first circuit board by a mechanical latch of the housing of the first circuit board configured to retain the second circuit board relative to the first circuit board.

8. The cable carrier adapter of claim 6, wherein the first circuit board comprises an industry standard form factor card.

9. The cable carrier adapter of claim 8, wherein the first circuit board comprises an Open Compute Platform network interface card.

10. The cable carrier adapter of claim 8, wherein the second circuit board comprises a card compliant with the industry standard form factor card that provides alternative function to an intent of an industry standard associated with the industry standard form factor card.

11. A method comprising:
  forming mechanical features in a cable carrier adapter such that the mechanical features are configured to mechanically couple a cable and a cable termination terminating the cable in a fixed position relative to the cable carrier adapter; and
  forming physical dimensions of the cable carrier adapter substantially similar to that of a second circuit board configured to electrically and mechanically couple to the first circuit board such that the cable carrier adapter is configured to mechanically engage with guiding features of a housing of the first circuit board for mechanically guiding the second circuit board relative to the first circuit board in order to guide the cable carrier adapter relative to the first circuit board to electrically couple the cable to the first circuit board via the cable termination.

12. The method of claim 11, wherein the physical dimensions are such that the cable carrier adapter is configured to be mechanically retained relative to the first circuit board by a mechanical latch of the housing of the first circuit board configured to retain the second circuit board relative to the first circuit board.

13. The method of claim 11, wherein the first circuit board comprises an industry standard form factor card.

14. The method of claim 13, wherein the first circuit board comprises an Open Compute Platform network interface card.

15. The method of claim 13, wherein the second circuit board comprises a card compliant with the industry standard form factor card that provides alternative function to an intent of an industry standard associated with the industry standard form factor card.

* * * * *